() United States Patent (10) Patent No.: US 9,412,857 B2
Yoshioka et al. (45) Date of Patent: Aug. 9, 2016

(54) NITRIDE SEMICONDUCTOR DEVICE AND METHOD FOR MANUFACTURING SAME

(71) Applicant: KABUSHIKI KAISHA TOSHIBA, Tokyo (JP)

(72) Inventors: Akira Yoshioka, Kanagawa (JP); Yasunobu Saito, Tokyo (JP); Hidetoshi Fujimoto, Kanagawa (JP); Tetsuya Ohno, Kanagawa (JP); Wataru Saito, Kanagawa (JP); Toru Sugiyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/593,703

(22) Filed: Jan. 9, 2015

(65) Prior Publication Data

US 2015/0123141 A1 May 7, 2015

Related U.S. Application Data

(62) Division of application No. 13/238,666, filed on Sep. 21, 2011, now abandoned.

(30) Foreign Application Priority Data

Mar. 23, 2011 (JP) ................................. 2011-064254

(51) Int. Cl.
*H01L 29/788* (2006.01)
*H01L 29/778* (2006.01)
(Continued)

(52) U.S. Cl.
CPC ........ *H01L 29/7787* (2013.01); *H01L 29/0661* (2013.01); *H01L 29/66462* (2013.01);
(Continued)

(58) Field of Classification Search
CPC .................................................. H01L 29/7786
See application file for complete search history.

(56) References Cited

U.S. PATENT DOCUMENTS 7,038,252 B2 5/2006 Saito et al.
7,157,748 B2 1/2007 Saito et al.
(Continued)

FOREIGN PATENT DOCUMENTS

CN 101853881 A 10/2010
JP H02211638 A 8/1990
(Continued)

OTHER PUBLICATIONS

Peal et al., "Accurate band gaps of AlGaN, InGaN, and AlInN alloys calculations based on LDA-1/2 approach," Appl. Phys. Lett. 98, 151907 (2011); http://dx.doi.org/10.1063/1.3576570.
(Continued)

*Primary Examiner* — Peniel M Gumedzoe
*Assistant Examiner* — Christopher Johnson
(74) *Attorney, Agent, or Firm* — Patterson & Sheridan, LLP

(57) ABSTRACT

According to one embodiment, a nitride semiconductor device includes a first semiconductor layer, a second semiconductor layer, a first electrode, a second electrode, a third electrode, a first insulating film and a second insulating film. The first semiconductor layer includes a nitride semiconductor. The second semiconductor layer is provided on the first layer, includes a nitride semiconductor, and includes a hole. The first electrode is provided in the hole. The second electrode is provided on the second layer. The third electrode is provided on the second layer so that the first electrode is disposed between the third and second electrodes. The first insulating film is provided between the first electrode and an inner wall of the hole and between the first and second electrodes, and is provided spaced from the third electrode. The second insulating film is provided in contact with the second layer between the first and third electrodes.

17 Claims, 10 Drawing Sheets

(51) Int. Cl.
*H01L 29/66* (2006.01)
*H01L 29/06* (2006.01)
*H01L 23/31* (2006.01)
*H01L 29/20* (2006.01)
*H01L 29/40* (2006.01)
*H01L 29/417* (2006.01)
*H01L 29/423* (2006.01)

(52) U.S. Cl.
CPC ......... *H01L29/7786* (2013.01); *H01L 23/3171* (2013.01); *H01L 29/2003* (2013.01); *H01L 29/402* (2013.01); *H01L 29/41758* (2013.01); *H01L 29/4236* (2013.01); *H01L 2924/0002* (2013.01)

(56) References Cited

U.S. PATENT DOCUMENTS

| | | |
|---|---|---|
| 2009/0072240 A1 | 3/2009 | Suh et al. |
| 2009/0206371 A1 | 8/2009 | Oka |
| 2010/0155720 A1 | 6/2010 | Kaneko |
| 2010/0230717 A1 | 9/2010 | Saito |
| 2010/0314663 A1 | 12/2010 | Ito et al. |
| 2011/0204418 A1 | 8/2011 | Onishi et al. |
| 2013/0009166 A1 | 1/2013 | Ito et al. |

FOREIGN PATENT DOCUMENTS

| | | |
|---|---|---|
| JP | H09306929 A | 11/1997 |
| JP | 2009054807 A | 3/2009 |
| JP | 2009267155 A | 11/2009 |
| JP | 2010050347 A | 3/2010 |
| JP | 2010153837 A | 7/2010 |

OTHER PUBLICATIONS

Arulkurmaran et al., "On the Effects of Gate-Recess Etching in Current-Collapse of Different Cap Layers Grown AlGaN/GaN High-Electron-Mobility Transistors," Jpn. J. Appl. Phys. 45 (2006) pp. L220-L223.
Japanese Office Action dated Jul. 4, 2013, filed in Japanese counterpart Application No. 2011-064254, 5 pages (with translation).
Chinese Office Action dated Mar. 3, 2014, filed in Chinese counterpart Application No. 201110255497.8, 13 pages (with translation).
Japanese Office Action dated Jan. 6, 2014, filed in Japanese counterpart Application No. 2011-064254, 4 pages (with translation).
Chinese Office Action dated Sep. 28, 2014, filed in Chinese counterpart Application No. 201110255497.8, 6 pages (with translation).

NITRIDE SEMICONDUCTOR DEVICE AND METHOD FOR MANUFACTURING SAME

CROSS-REFERENCE TO RELATED APPLICATIONS

This application is a division of U.S. patent application Ser. No. 13/238,666, filed on Sep. 21, 2011, which is based upon and claims the benefit of priority from the prior Japanese Patent Application No. 2011-064254, filed on Mar. 23, 2011, the entire contents of each of which are incorporated herein by reference.

FIELD

Embodiments described herein relate generally to a nitride semiconductor device and a method for manufacturing the same.

BACKGROUND

Devices using new materials taking the place of silicon, such as silicon carbide (SiC) and nitride semiconductors, are developed these days.

As an example, it is known that if a hetero-junction in which gallium nitride (GaN), which is a nitride semiconductor, and an aluminum gallium nitride (AlGaN) are stacked is formed, two-dimensional electron gas (2DEG) is generated at the interface of the hetero-junction. A hetero-structure field effect transistor (HFET) unitizing the 2DEG as a channel has the properties of high breakdown voltage and low ON resistance.

Here, as a structure to achieve normally OFF operation in the GaN-based HFET, there is a structure in which a recess structure is formed and a gate electrode is formed via an insulating film. There is a need for further improvement to obtain low ON resistance, high breakdown voltage, and high reliability in such a nitride semiconductor device.

DETAILED DESCRIPTION

Figure 1:
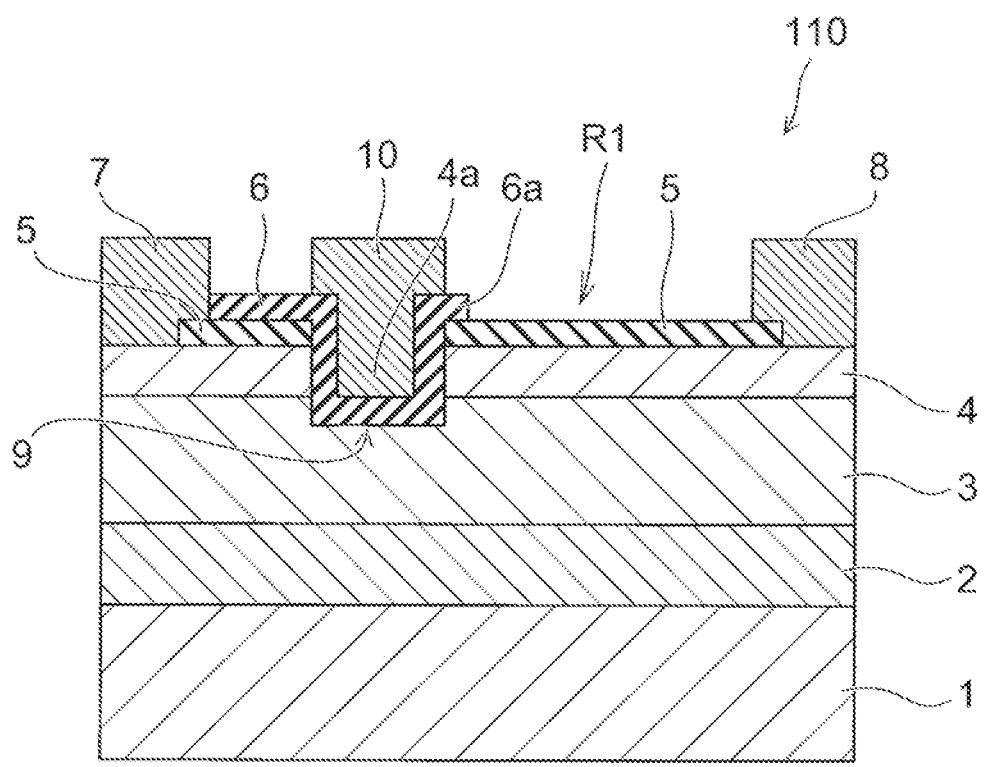
FIG. 1 is a schematic cross-sectional view illustrating the configuration of a nitride semiconductor device according to a first embodiment.

In general, according to one embodiment, a nitride semiconductor device includes a first semiconductor layer, a second semiconductor layer, a first electrode, a second electrode, a third electrode, a first insulating film and a second insulating film. The first semiconductor layer includes a nitride semiconductor. The second semiconductor layer is provided on the first semiconductor layer, includes a nitride semiconductor having a band gap wider than a band gap of the first semiconductor layer, and includes a hole. The first electrode is provided in the hole. The second electrode is provided on the second semiconductor layer and electrically connected to the second semiconductor layer. The third electrode is provided on the second semiconductor layer so that the first electrode is disposed between the third electrode and the second electrode. The third electrode is electrically connected to the second semiconductor layer. The first insulating film includes oxygen, is provided between the first electrode and an inner wall of the hole and between the first electrode and the second electrode, and is provided spaced from the third electrode. The second insulating film includes nitrogen and is provided in contact with the second semiconductor layer between the first electrode and the third electrode.

In general, according to one embodiment, a method is disclosed for manufacturing a nitride semiconductor device. The method can include forming a first semiconductor layer including a nitride semiconductor on a support substrate, and forming a second semiconductor layer having a band gap wider than a band gap of the first semiconductor layer and including a nitride semiconductor on the first semiconductor layer. The method can include forming a second insulating film including nitrogen on the second semiconductor layer. The method can include forming a hole by removing parts of the second insulating film and the second semiconductor layer. The method can include forming a first insulating film including oxygen so as to cover an inner wall of the hole and the second insulating film. The method can include removing at least a part of the first insulating film on one side as viewed from the hole. The method can include forming a second electrode electrically connected to the second semiconductor layer on another side as viewed from the hole, and forming a third electrode electrically connected to the second semiconductor layer on the one side as viewed from the hole spaced from the first insulating film. In addition, the method can include forming a first electrode in the hole via the first insulating film.

Various embodiments will be described hereinafter with reference to the accompanying drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with the same reference numerals, and a detailed description is omitted as appropriate.

First Embodiment

FIG. 1 is a schematic cross-sectional view illustrating the configuration of a nitride semiconductor device according to a first embodiment.

Figure 2:
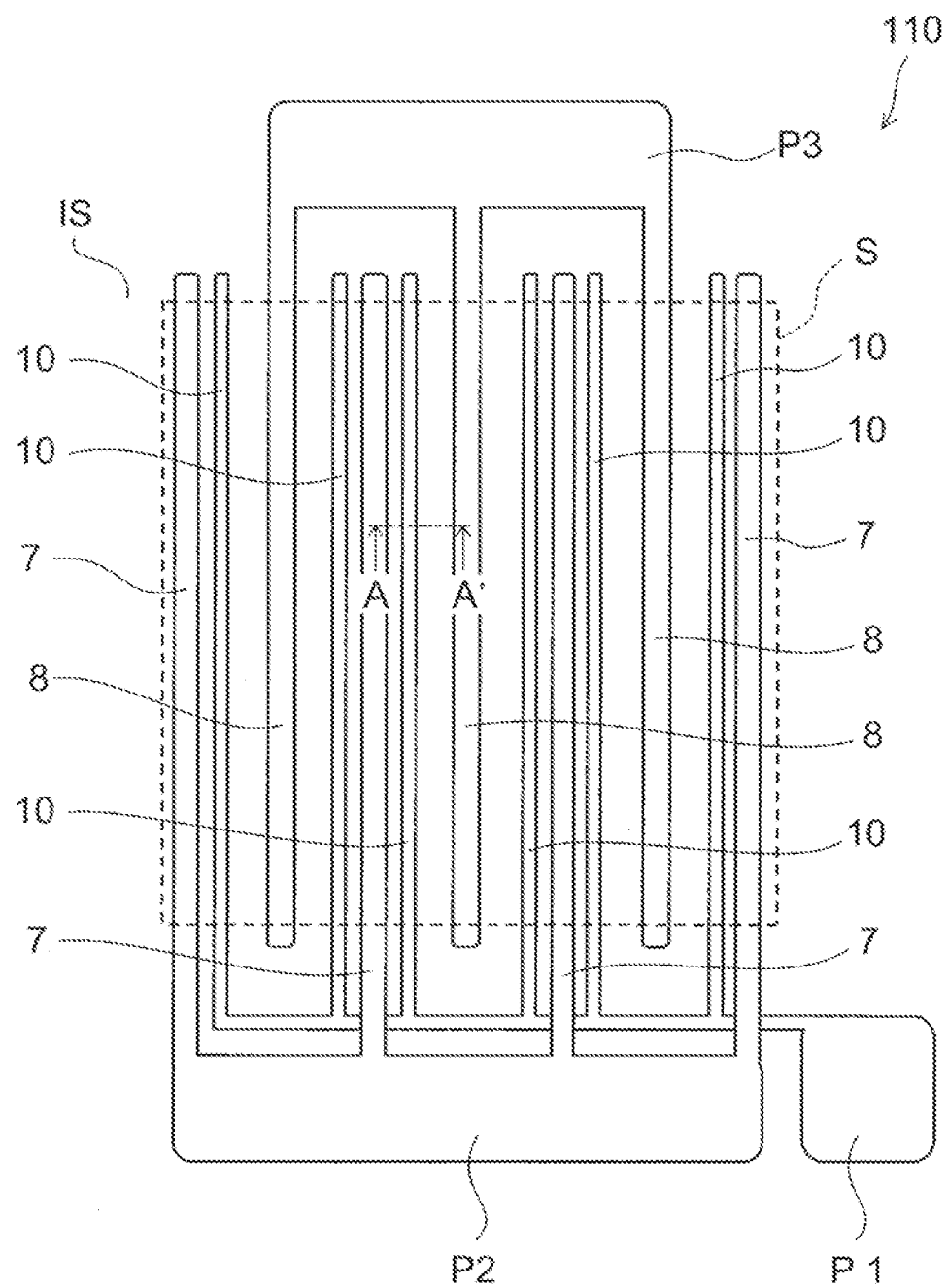
FIG. 2 is a schematic plan view of the nitride semiconductor device according to the first embodiment.

FIG. 2 is a schematic plan view of the nitride semiconductor device according to the first embodiment.

FIG. 1 is a schematic cross-sectional view taken in the direction of arrows A-A' shown in FIG. 2.

As shown in FIG. 1, a nitride semiconductor device 110 according to the first embodiment includes a first semiconductor layer 3, a second semiconductor layer 4, a first electrode 10, a second electrode 7, a third electrode 8, a first insulating film 6, and a second insulating film 5.

In the nitride semiconductor device 110, the first semiconductor layer 3 is formed via a buffer layer 2 formed on a support substrate 1. Here, for convenience of description, the direction from the first semiconductor layer 3 toward the second semiconductor layer 4 is referred to as upward (the upper side), the opposite direction is referred to as downward (the lower side).

The first semiconductor layer 3 includes a nitride semiconductor. The second semiconductor layer 4 is provided on the first semiconductor layer 3. The second semiconductor layer 4 includes a nitride semiconductor having a band gap wider than the band gap of the first semiconductor layer 3. The second semiconductor layer 4 includes a hole 4a. The hole 4a illustrated in FIG. 1 reaches the first semiconductor layer 3.

Here, in the specification, "nitride semiconductor" includes all semiconductors expressed by the chemical formula of $B_\alpha In_\beta Al_\gamma Ga_{1-\alpha-\beta-\gamma}N$ ($0 \leq \alpha \leq 1$, $0 \leq \beta \leq 1$, $0 \leq \gamma \leq 1$, $0 \leq \alpha+\beta+\gamma \leq 1$) in which composition ratios $\alpha$, $\beta$, and $\gamma$ are changed in the respective ranges. Furthermore, in the chemical formula mentioned above, those further including a group V element other than N (nitrogen), those further including various elements added in order to control various properties such as the conduction type, and those further including various elements unintendedly included are also included in the "nitride semiconductor."

In the embodiment, GaN and AlGaN, which are group III-V nitride semiconductors, are used as examples of the nitride semiconductor.

The nitride semiconductor device 110 is a normally OFF field effect transistor.

An undoped $Al_X Ga_{1-X}N$ ($0 \leq X \leq 1$) is used for the first semiconductor layer 3. Here, "undoped" refers to a state where intended impurity doping is not performed. As an example, in the embodiment, the first semiconductor layer 3 is GaN. The first semiconductor layer 3 functions as a channel layer.

An undoped $Al_Y Ga_{1-Y}N$ ($0 \leq Y \leq 1$, $X \leq Y$) is used for the second semiconductor layer 4. As an example, in the embodiment, the second semiconductor layer 4 is AlGaN with an Al content of 25 percent (%). The band gap of the second semiconductor layer 4 that is undoped AlGaN is wider than the band gap of the first semiconductor layer 3 that is undoped GaN.

The first electrode 10 is provided in the hole 4a. The first insulating film 6 is provided between the first electrode 10 and the inner wall of the hole 4a. In other words, the first electrode 10 has a portion embedded in the hole 4a via the first insulating film 6. A recess structure 9 is formed by embedding the first electrode 10 in the hole 4a via the first insulating film 6. In the embodiment, the first electrode 10 is a gate electrode. In this example, the gate electrode is a MIS (metal insulator semiconductor) gate electrode.

The second electrode 7 is provided on the second semiconductor layer 4 and electrically connected to the second semiconductor layer 4. In other words, the second electrode 7 is joined to the second semiconductor layer 4 by ohmic junction. In the embodiment, the second electrode 7 is a source electrode.

The third electrode 8 is provided on the second semiconductor layer 4 so that the first electrode 10 is disposed between the third electrode 8 and the second electrode 7. The third electrode 8 is electrically connected to the second semiconductor layer 4. In other words, the third electrode 8 is joined to the second semiconductor layer 4 by ohmic junction. In the embodiment, the third electrode 8 is a drain electrode.

The first insulating film 6 is a film including oxygen. The first insulating film 6 is provided between the first electrode 10 and the inner wall of the hole 4a and between the first electrode 10 and the second electrode 7. The first insulating film 6 is provided spaced from the third electrode 8. That is, a region where the first insulating film 6 is not provided is present between an end 6a of the first insulating film 6 on the third electrode 8 side and the third electrode 8.

Silicon oxide ($SiO_2$), for example, is used for the first insulating film 6.

The second insulating film 5 is a film including nitrogen. The second insulating film 5 is provided in contact with the second semiconductor layer 4 between the first electrode 10 and the third electrode 8.

Silicon nitride ($SiN_x$), for example, is used for the second insulating film 5.

As shown in FIG. 2, the first electrode 10, the second electrode 7, and the third electrode 8 each are provided in a plurality and extend in one direction. The second electrode 7 and the third electrode 8 are alternately arranged and connected to the respective pads P2 and P3 on the sides opposite to each other. In other words, the second electrode 7 and the third electrode 8 extend from the respective pads P2 and P3 in a comb teeth configuration and are alternately arranged. The first electrode 10 is placed between the second electrode 7 and the third electrode 8 adjacent to each other. The plurality of first electrodes 10 are electrically connected to a pad P1 on one side.

In the example shown in FIG. 2, four second electrodes 7 aligned parallel and three third electrodes 8 aligned parallel are disposed in mutual spaces. The first electrode 10 is placed in a position near to the second electrode 7 between the second electrode 7 and the third electrode 8. In other words, the space between the first electrode 10 and the third electrode 8 is wider than the space between the first electrode 10 and the second electrode 7.

A configuration is formed in which a plurality of elements (field effect transistors) are connected in parallel corresponding to such a layout of electrodes. A region around an element region S in which the plurality of elements are formed forms an element isolation region IS.

In the nitride semiconductor device 110 thus configured, for example, a voltage is applied to the first electrode (gate electrode) 10 to control the current flowing between the third electrode 8 and the second electrode 7 in a state where the second electrode (source electrode) 7 is grounded and a plus voltage is applied to the third electrode (drain electrode) 8.

As shown in FIG. 1, the interface between the first semiconductor layer (undoped GaN) 3, which is a channel through which a current flows, and the second semiconductor layer (undoped AlGaN) 4 is divided by the recess structure 9 provided between the third electrode 8 and the second electrode 7. Thus, by applying a voltage positive with respect to the second electrode 7 to the first electrode 10, electrons can be generated at the interface between the first semiconductor layer 3 and the second insulating film 5. Thereby, a drain current can be passed from the third electrode 8 to the second electrode 7. That is, the nitride semiconductor device 110 according to the embodiment achieves normally OFF operation.

In the nitride semiconductor device 110 according to the embodiment, the interface between the first insulating film 6 that is, for example, $SiO_2$ and the first semiconductor layer 3 that is, for example, GaN is used as the interface that forms a channel below the first electrode 10. By using $SiO_2$ as the first insulating film 6 that forms a gate insulating film, an element having low ON resistance and high reliability can be provided as compared to the case of using $SiN_x$ as the gate insulating film.

That is, $SiO_2$ has a large band gap and is suitable as an insulating film of electrons to GaN. Furthermore, $SiO_2$ is a stable amorphous material and easily provides a film with a small number of trapping centers. Thereby, the reliability in regard to the gate insulating film of the transistor can be improved, and operational stability in the ON state of the transistor can be obtained.

Furthermore, between the first electrode 10 and the third electrode 8, the second insulating film 5 that is $SiN_x$ is provided on the surface of the second semiconductor layer 4 that is AlGaN in a state of contact with the second semiconductor layer 4. Thereby, the second insulating film 5 functions as a protection film of the second semiconductor layer 4. By protecting the second semiconductor layer 4 with the second insulating film 5 that is $SiN_x$, the breakdown voltage of the nitride semiconductor device 110 is increased.

Here, in the case where a stacked structure of $SiN_x$ and $SiO_2$ is formed as an insulating film provided on the second semiconductor layer 4 that is a nitride semiconductor, the oxygen of the $SiO_2$ may diffuse into the film of $SiN_x$.

For example, to stabilize the interface between the $SiO_2$ that is the gate insulating film and the nitride semiconductor (GaN or AlGaN) that is the second semiconductor layer 4, heat treatment of 600° C. or more, for example, is needed. During the heating, the oxygen of the $SiO_2$ may diffuse into the film of $SiN_x$.

If the oxygen diffuses into the film of $SiN_x$, the surface of the nitride semiconductor in contact with the film of $SiN_x$ may be oxidized. In view of this, to sufficiently protect the nitride semiconductor with the insulating film of $SiN_x$, the film thickness may be thickened. However, if the film thickness of the $SiN_x$ is thickened, due to the stress caused by the difference in the coefficient of thermal expansion with the film of $SiO_2$ stacked with the film of $SiN_x$, the surface of the nitride semiconductor is degraded and a decrease in reliability may be caused.

In the embodiment, on the third electrode 8 side of the recess structure 9, the first insulating film 6 that is $SiO_2$ is provided spaced from the third electrode 8. That is, $SiO_2$ is not superposed on $SiN_x$ in a region R1 that is the space between the first insulating film 6 and the third electrode 8. In other words, since $SiO_2$ that may cause oxidation of the surface of the second semiconductor layer (nitride semiconductor) 4 is not provided in the region R1, the oxidation of the surface of the second semiconductor layer 4 resulting from the oxygen of $SiO_2$ can be suppressed.

Here, the trapping of electrons at the surface of the nitride semiconductor that may cause current collapse mainly occurs in a region at some distance from the recess structure 9, in particular on the drain side (the third electrode 8 side) of the end of the first electrode 10 that is the gate electrode. In view of this, a configuration is employed in which the first insulating film ($SiO_2$) 6 is not provided on the second insulating film ($SiN_x$) 5 between the first electrode 10 and the third electrode 8, and the end of the first insulating film 6 exists as close as possible to the end of the first electrode 10. Thereby, the ON resistance increase due to current collapse can be suppressed to a minimum.

Thus, the nitride semiconductor device 110 according to the embodiment can achieve the following: (1) by using $SiO_2$ as the first insulating film 6 that forms the gate insulating film, the ON resistance is reduced and the reliability is improved; (2) by protecting the second semiconductor layer 4 with the second insulating film 5 that is $SiN_x$, the breakdown voltage is increased; and (3) by not superposing $SiO_2$ on $SiN_x$ in the region R1, the ON resistance increase due to current collapse is suppressed to a minimum.

Figure 3:
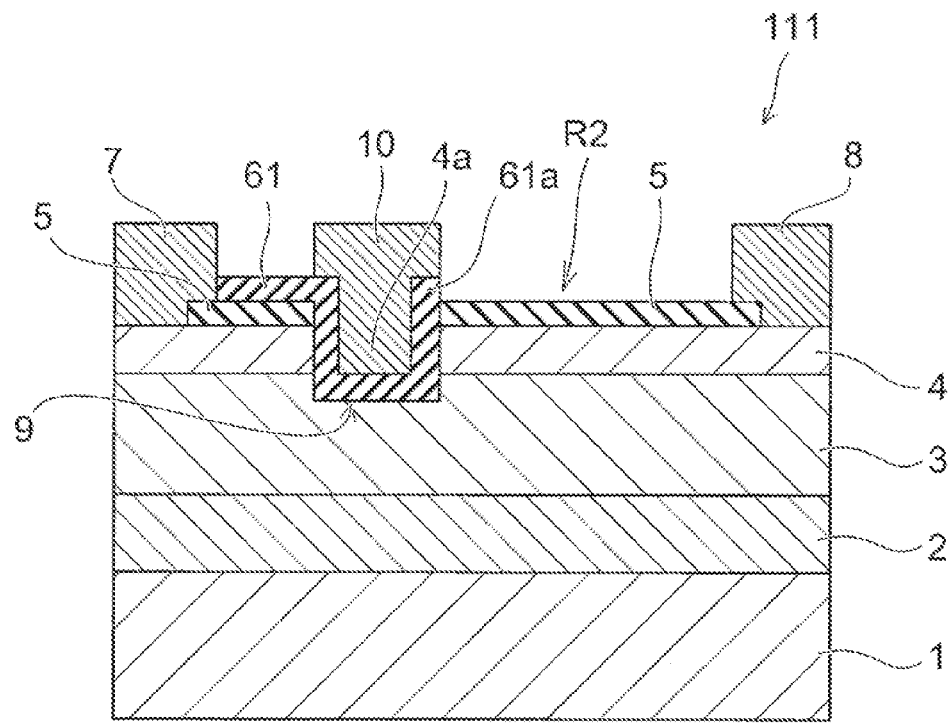
FIG. 3 is a schematic cross-sectional view illustrating the configuration of another nitride semiconductor device according to the first embodiment.

FIG. 3 is a schematic cross-sectional view illustrating the configuration of another nitride semiconductor device according to the first embodiment.

As shown in FIG. 3, a nitride semiconductor device 111 differs from the nitride semiconductor device 110 shown in FIG. 1 in the respect of an end 61a of a first insulating film 61 on the third electrode 8 side.

In the first insulating film 61 of the nitride semiconductor device 111, the end 61a on the third electrode 8 side is not provided on the second insulating film 5. The first insulating film 61 is formed along the inner wall of the hole 4a, and, on the third electrode 8 side, the first insulating film 61 is provided so as to stand up along the inner wall and not to cover the second insulating film 5.

In the nitride semiconductor device 111 thus configured, the space between the first insulating film 61 and the third electrode 8 is configured to be larger than that of the nitride semiconductor device 110. That is, in a region R2 that is the space between the first insulating film 61 and the third electrode 8, the first insulating film 61 is not provided on the second insulating film 5. The region R2 is larger than the region R1. Therefore, in the nitride semiconductor device 111, the oxidation of the surface of the second semiconductor layer (nitride semiconductor) 4 resulting from the oxygen of the $SiO_2$ that is the first insulating film 61 can be more effectively suppressed than in the nitride semiconductor device 110.

Figure 4:
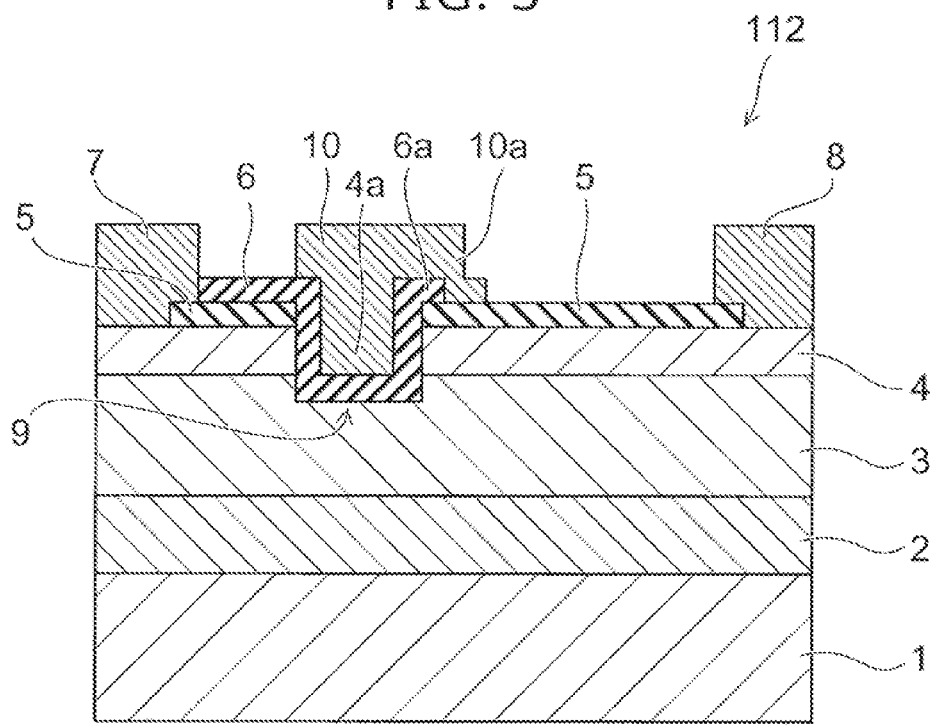
FIG. 4 is a schematic cross-sectional view illustrating the configuration of still another nitride semiconductor device according to the first embodiment.

FIG. 4 is a schematic cross-sectional view illustrating the configuration of still another nitride semiconductor device according to the first embodiment.

As shown in FIG. 4, a nitride semiconductor device 112 differs from the nitride semiconductor device 110 shown in FIG. 1 in the shape of the end of the first electrode 10.

More specifically, an end 10a of the first electrode 10 of the nitride semiconductor device 112 is provided so as to extend to the third electrode 8 side and cover the end 6a of the first insulating film 6.

By such a structure of the first electrode 10, the shield effect of the electric field can be exhibited for the end 6a of the first insulating film 6.

That is, the electric field applied between the first electrode 10 that is the gate electrode and the third electrode 8 that is the drain electrode is concentrated at the end 10a of the first electrode 10 on the third electrode 8 side. On the other hand, the end 6a of the first insulating film 6 on the third electrode 8 side is configured to exist on the second insulating film 5. At the end 6a of the first insulating film 6, the oxygen of the $SiO_2$ may affect the second semiconductor layer 4 that is a nitride semiconductor, and if a high electric field is applied to here, current collapse may be caused.

In view of this, the end 10a of the first electrode 10 is formed so as to cover the outside of the end 6a of the first insulating film 6 like the nitride semiconductor device 112. Thereby, the surface of the second semiconductor layer 4 that has experienced the effect of oxidation due to the first insulating film 6 that is SiO$_2$ is shielded by the first electrode 10, and protected from a high electric field. Thus, the factor in current collapse can be suppressed.

Figure 5:
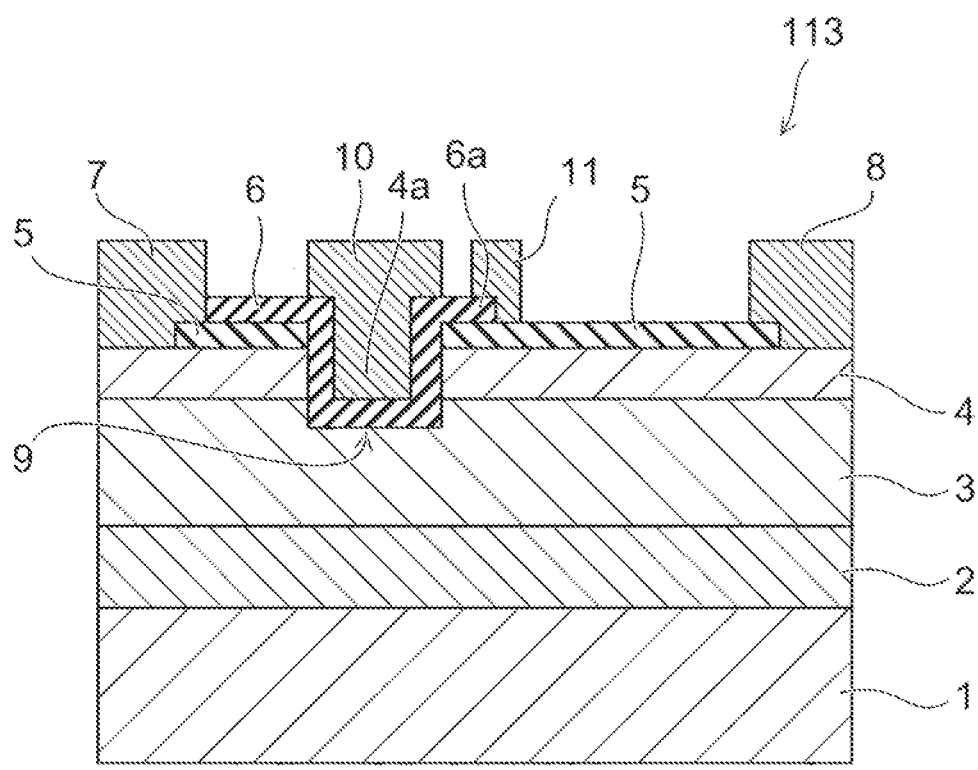
FIG. 5 is a schematic cross-sectional view illustrating the configuration of still another nitride semiconductor device according to the first embodiment.

FIG. 5 is a schematic cross-sectional view illustrating the configuration of still another nitride semiconductor device according to the first embodiment.

As shown in FIG. 5, a nitride semiconductor device 113 differs from the nitride semiconductor device 110 shown in FIG. 1 in that a fourth electrode 11 is added.

More specifically, the fourth electrode 11 is provided so as to cover the end 6a of the first insulating film 6. Although the fourth electrode 11 is spaced from the first electrode 10 that is the gate electrode, both are electrically connected.

By providing the fourth electrode 11 thus configured, the surface of the second semiconductor layer 4 that has experienced the effect of oxidation due to the first insulating film 6 that is SiO$_2$ is shielded by the fourth electrode 11, and protected from a high electric field. Thereby, the factor in current collapse can be suppressed.

Second Embodiment

Figure 6:
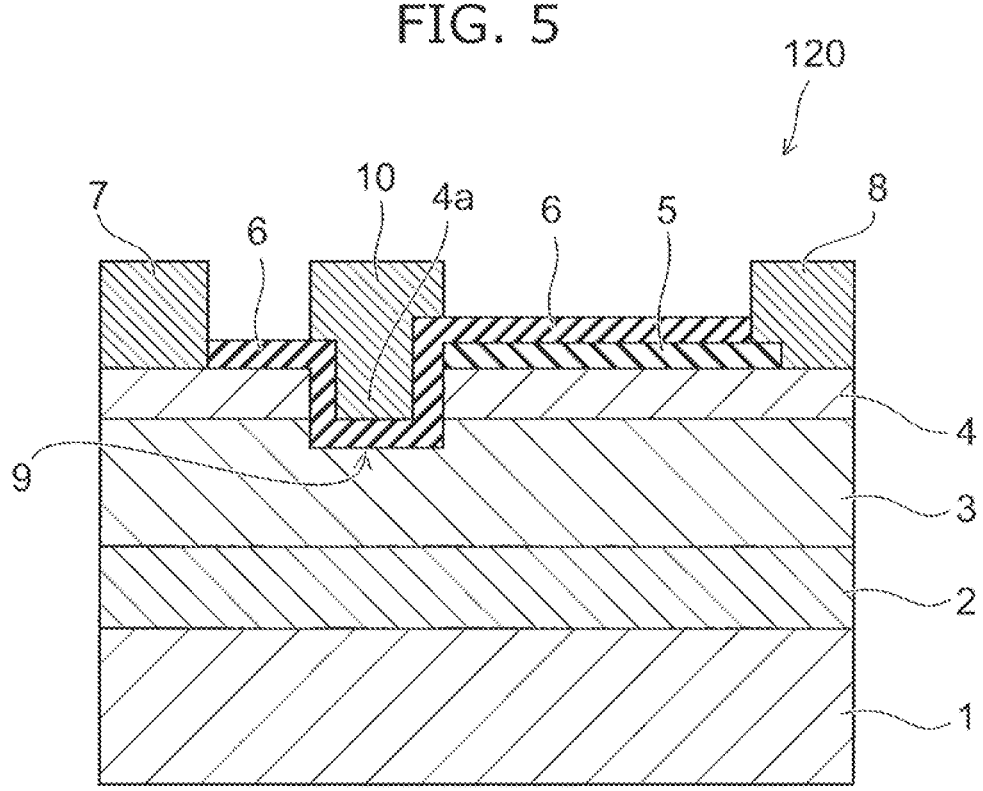
FIG. 6 is a schematic cross-sectional view illustrating the configuration of a nitride semiconductor device according to a second embodiment.

FIG. 6 is a schematic cross-sectional view illustrating the configuration of a nitride semiconductor device according to a second embodiment.

As shown in FIG. 6, a nitride semiconductor device 120 according to the second embodiment includes the first semiconductor layer 3, the second semiconductor layer 4, the first electrode 10, the second electrode 7, the third electrode 8, the first insulating film 6, and the second insulating film 5.

In the nitride semiconductor device 120 according to the second embodiment, the first insulating film 6 is provided in contact with the second semiconductor layer 4 between the first electrode 10 and the second electrode 7.

An insulating film provided between the first electrode 10 that is the gate electrode and the second electrode 7 that is the source electrode influences the operating characteristics of the nitride semiconductor device 120. For example, the hysteresis of the drain current to the gate voltage is influenced.

By using the first insulating film 6 that is SiO$_2$ as the insulating film in contact with the second semiconductor layer 4 between the first electrode 10 and the second electrode 7 like the embodiment, the influence of the hysteresis mentioned above can be suppressed as compared to the case of SiN$_x$.

Third Embodiment

Figure 7:
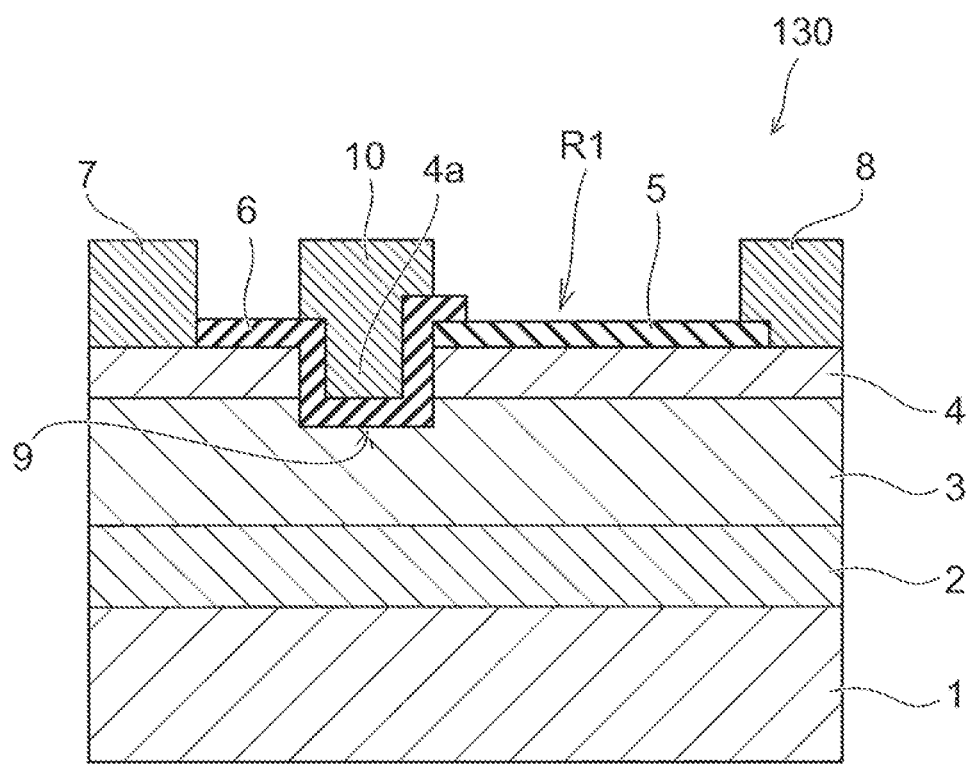
FIG. 7 is a schematic cross-sectional view illustrating the configuration of a nitride semiconductor device according to a third embodiment.

FIG. 7 is a schematic cross-sectional view illustrating the configuration of a nitride semiconductor device according to a third embodiment.

As shown in FIG. 7, a nitride semiconductor device 130 according to the third embodiment differs from the nitride semiconductor device 110 shown in FIG. 1 in the respect of the insulating film between the first electrode 10 and the second electrode 7.

More specifically, in the nitride semiconductor device 130, the first insulating film 6 provided between the first electrode 10 and the second electrode 7 is provided in contact with the second semiconductor layer 4.

In the nitride semiconductor device 130 thus configured, the effects of (1) to (3) mentioned above can be obtained similarly to the nitride semiconductor device 110 by using SiO$_2$ as the first insulating film 6 that forms the gate insulating film, protecting the second semiconductor layer 4 with the second insulating film 5 that is SiN$_x$, and not superposing SiO$_2$ on SiN$_x$ in the region R1.

Furthermore, in the nitride semiconductor device 130, since the first insulating film 6 provided between the first electrode 10 and the second electrode 7 is provided in contact with the second semiconductor layer 4, similar effects to the nitride semiconductor device 120 can be obtained. That is, the influence of the hysteresis of the operating characteristics (the drain current to the gate voltage) of the nitride semiconductor device 130 can be suppressed.

Fourth Embodiment

A fourth embodiment is a method for manufacturing the nitride semiconductor devices 110, 111, 112, and 113 according to the first embodiment. Herein, a method for manufacturing the nitride semiconductor device 112 is described as an example.

FIG. 8A to FIG. 9C are schematic cross-sectional views describing an example of the method for manufacturing the nitride semiconductor device 112 sequentially.

Figure 8A:
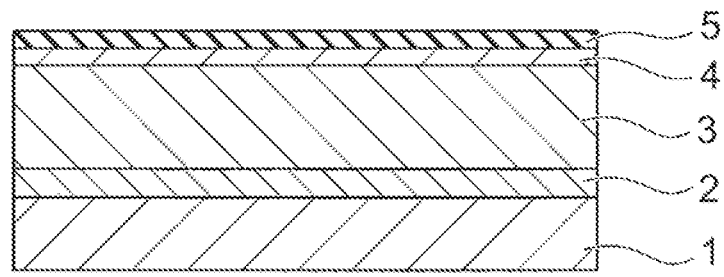
FIG. 8A to FIG. 9C are schematic cross-sectional views describing an example of a manufacturing method sequentially.

First, as shown in FIG. 8A, the buffer layer 2 is formed on the support substrate 1, and the first semiconductor layer 3 and the second semiconductor layer 4 are formed thereon. The first semiconductor layer 3 is, for example, GaN. The second semiconductor layer 4 is, for example, AlGaN. The first semiconductor layer 3 and the second semiconductor layer 4 are sequentially stacked using, for example, an MOCVD (metal organic chemical vapor deposition) method.

SiN$_x$ that is the second insulating film 5 is formed on the second semiconductor layer 4. The second insulating film 5 has a thickness of, for example, approximately 10 nanometers (nm) to 20 nm.

Figure 8B:
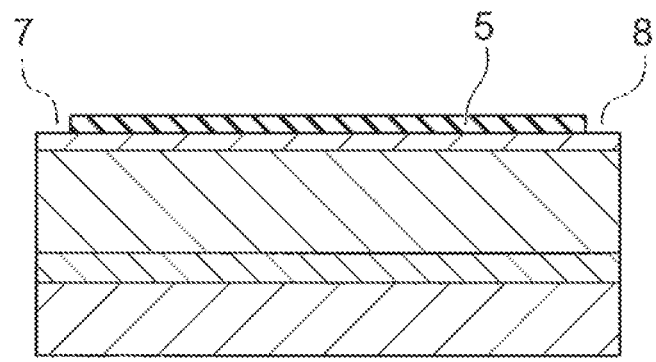

Next, as shown in FIG. 8B, openings are formed in the positions in the second insulating film 5 where the second electrode 7 and the third electrode 8 will be formed. The opening is formed by, for example, performing wet etching on the second insulating film 5.

Figure 8C:
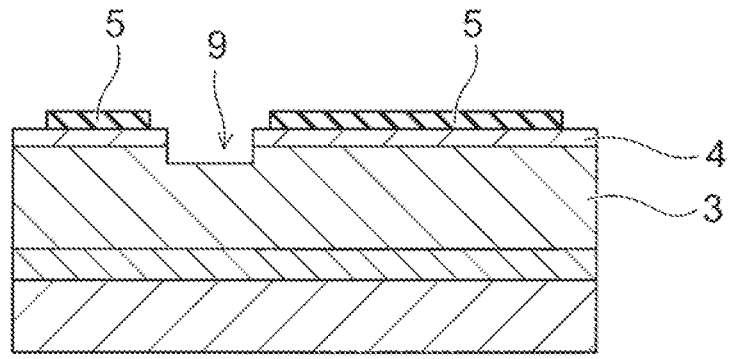

Next, as shown in FIG. 8C, parts of the second insulating film 5, the second semiconductor layer 4, and the first semiconductor layer 3 are etched to form the hole 4a. The second insulating film 5 made of SiN$_x$ is removed by, for example, wet etching, and the second semiconductor layer 4 that is AlGaN and the first semiconductor layer 3 that is GaN are removed by, for example, dry etching.

Figure 8D:
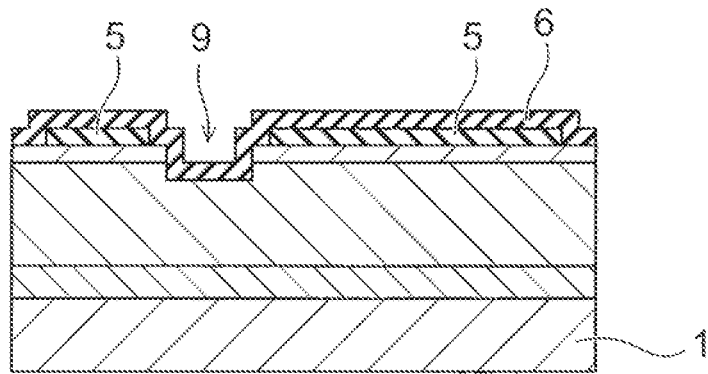

Next, as shown in FIG. 8D, SiO$_2$ that is the first insulating film 6 is formed over the entire surface of the support substrate 1. The SiO$_2$ that is the first insulating film 6 is formed by, for example, CVR (chemical vapor reaction). The first insulating film 6 is formed on the inner wall of the hole 4a and on the second insulating film 5.

Figure 9A:
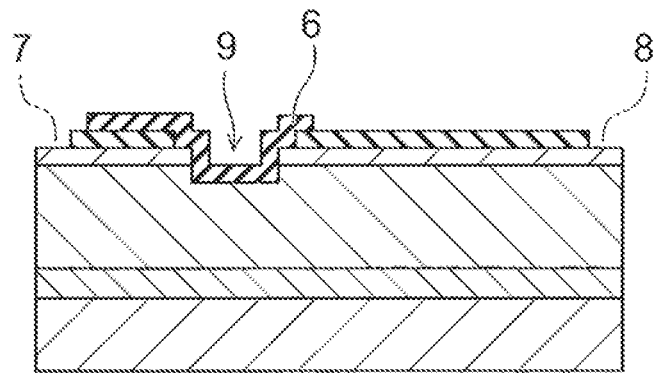

Next, as shown in FIG. 9A, the etching of the first insulating film 6 is performed. In the etching, the first insulating film 6 is removed in the position where the second electrode 7 will be formed and in the region from the position where the third electrode 8 will be formed to the position of the hole 4a. The first insulating film 6 that is SiO$_2$ is removed by, for example, wet etching. After the first insulating film 6 is etched, PDA (post-deposition annealing) treatment is performed. As the PDA treatment, for example, heat treatment of 900° C. and about 10 minutes is performed. This stabilizes the interface between the SiO$_2$ that is the first insulating film 6 and the nitride semiconductor (GaN or AlGaN).

Figure 9B:
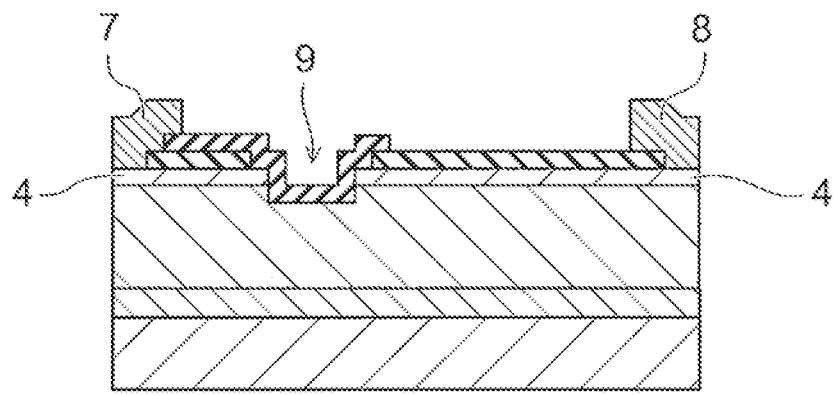

Next, as shown in FIG. 9B, the second electrode 7 and the third electrode 8 are formed in the respective positions where the second semiconductor layer 4 is exposed. The third electrode 8 is formed on one side as viewed from the hole 4a, and the second electrode 7 is formed on the other side as viewed from the hole 4a. The second electrode 7 and the third electrode 8 are joined to the second semiconductor layer 4 by ohmic junction by, for example, heat treatment of 650° C. and approximately 15 seconds. The second electrode 7 functions as the source electrode, and the third electrode 8 functions as the drain electrode.

After the second electrode 7 and the third electrode 8 are formed, an element isolation region (not shown) is formed around the element region.

Figure 9C:
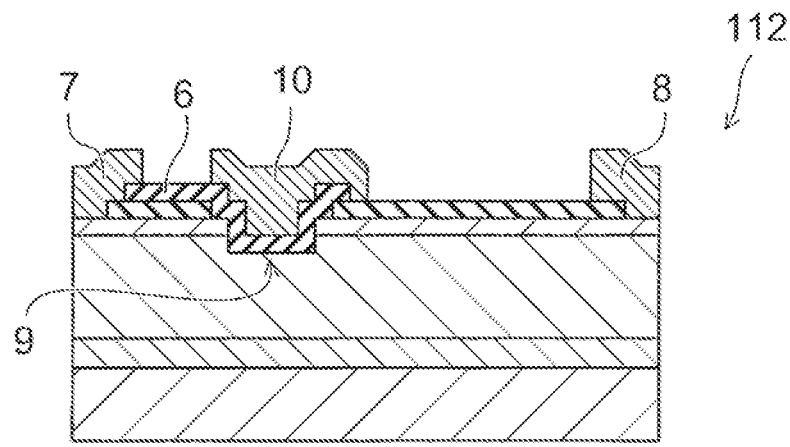

Then, as shown in FIG. 9C, the first electrode 10 is formed in the hole 4a. The first electrode 10 is formed in the hole 4a via the first insulating film 6. Thereby, the recess structure 9 is formed. The first electrode 10 functions as the gate electrode. Thereby, the nitride semiconductor device 112 is completed in which the first insulating film 6 that is $SiN_x$ is provided spaced from the third electrode 8 on the third electrode 8 side of the recess structure 9. The nitride semiconductor devices 110, 111, and 113 can be manufactured by similar processes other than that the shape to be etched of the first electrode 10 shown in FIG. 9C is altered.

Fifth Embodiment

A fifth embodiment is a method for manufacturing the nitride semiconductor device 120 according to the second embodiment.

FIG. 10A to FIG. 11C are schematic cross-sectional views describing an example of the method for manufacturing the nitride semiconductor device 120 sequentially.

Figure 10A:
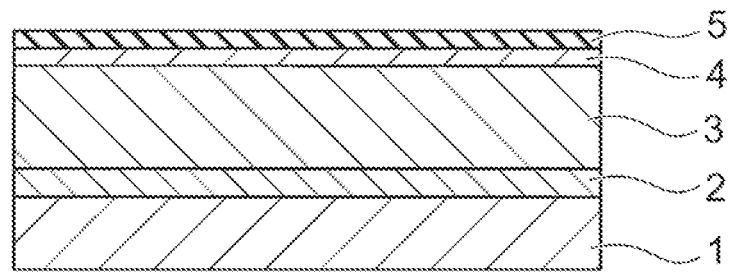
FIG. 10A to FIG. 11C are schematic cross-sectional views describing an example of a manufacturing method sequentially.

First, as shown in FIG. 10A, the buffer layer 2 is formed on the support substrate 1, and the first semiconductor layer 3 and the second semiconductor layer 4 are formed thereon. The first semiconductor layer 3 is, for example, GaN. The second semiconductor layer 4 is, for example, AlGaN. $SiN_x$ that is the second insulating film 5 is formed on the second semiconductor layer 4. The second insulating film 5 has a thickness of, for example, approximately 10 nm to 20 nm.

Figure 10B:
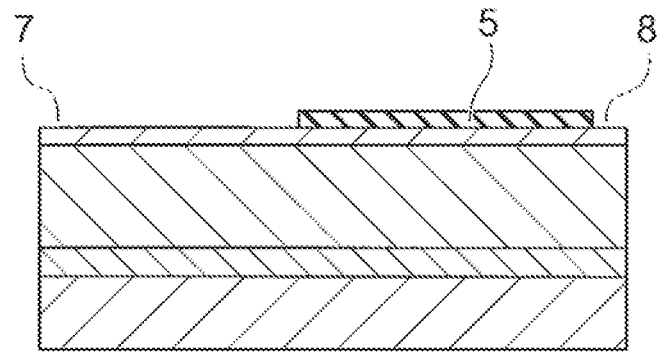

Next, as shown in FIG. 10B, in the second insulating film 5, openings are formed in the position where the third electrode 8 will be formed and in the region from the position where the hole 4a will be formed to the position where the second electrode 7 will be formed. The opening is formed by, for example, performing wet etching on the second insulating film 5.

Figure 10C:
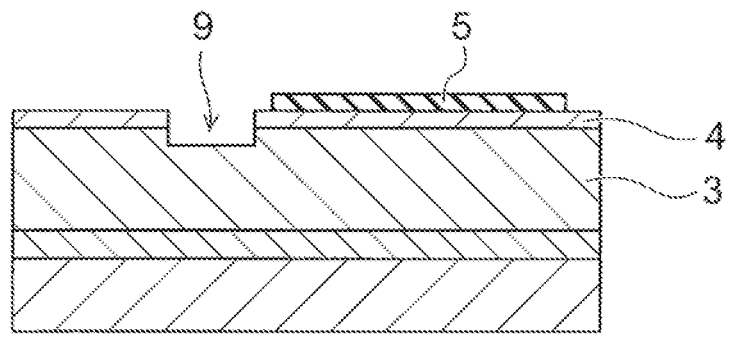

Next, as shown in FIG. 10C, part of the exposed portion of the second semiconductor layer 4 and part of the first semiconductor layer 3 are etched to form the hole 4a. The second semiconductor layer 4 that is AlGaN and the first semiconductor layer 3 that is GaN are removed by, for example, dry etching.

Figure 10D:
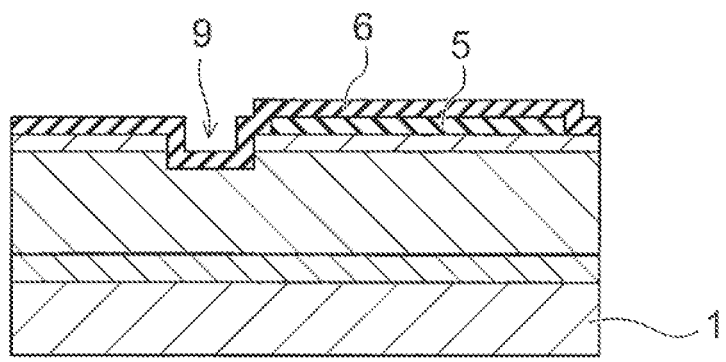

Next, as shown in FIG. 10D, $SiO_2$ that is the first insulating film 6 is formed over the entire surface of the support substrate 1. The $SiO_2$ that is the first insulating film 6 is formed by, for example, CVR. The first insulating film 6 is formed on the inner wall of the hole 4a, on the second insulating film 5 on one side of the hole 4a, and on the second semiconductor layer 4 on the other side of the hole 4a.

Figure 11A:
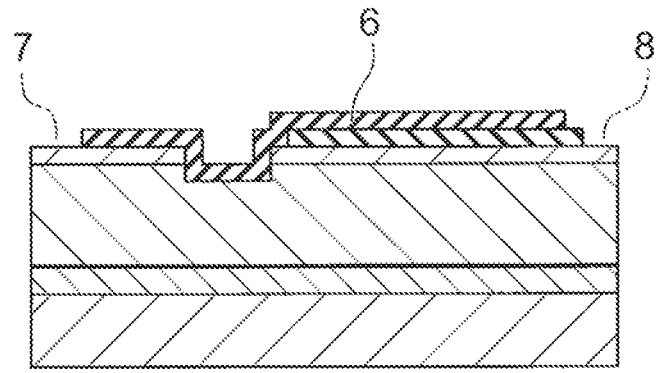

Next, as shown in FIG. 11A, the etching of the first insulating film 6 is performed. In the etching, the first insulating film 6 is removed in the position where the second electrode 7 will be formed and the position where the third electrode 8 will be formed. The first insulating film 6 that is $SiO_2$ is removed by, for example, wet etching. After the first insulating film 6 is etched, PDA treatment is performed. As the PDA treatment, for example, heat treatment of 900° C. and approximately 10 minutes is performed. This stabilizes the interface between the $SiO_2$ that is the first insulating film 6 and the nitride semiconductor (GaN or AlGaN).

Figure 11B:
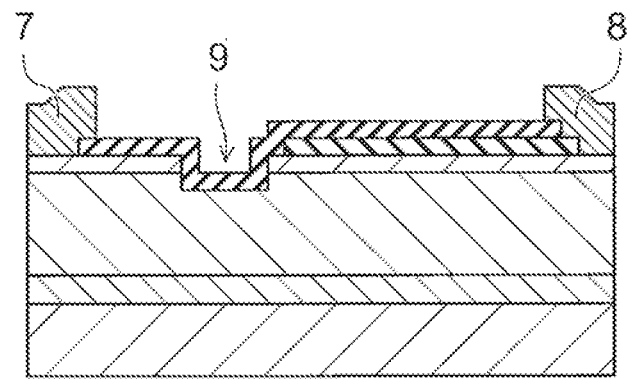

Next, as shown in FIG. 11B, the second electrode 7 and the third electrode 8 are formed in the respective positions where the second semiconductor layer 4 is exposed. The third electrode 8 is formed on one side as viewed from the hole 4a, and the second electrode 7 is formed on the other side as viewed from the hole 4a. The second electrode 7 and the third electrode 8 are joined to the second semiconductor layer 4 by ohmic junction by, for example, heat treatment of 650° C. and approximately 15 seconds. The second electrode 7 functions as the source electrode, and the third electrode 8 functions as the drain electrode.

After the second electrode 7 and the third electrode 8 are formed, an element isolation region (not shown) is formed around the element region.

Figure 11C:
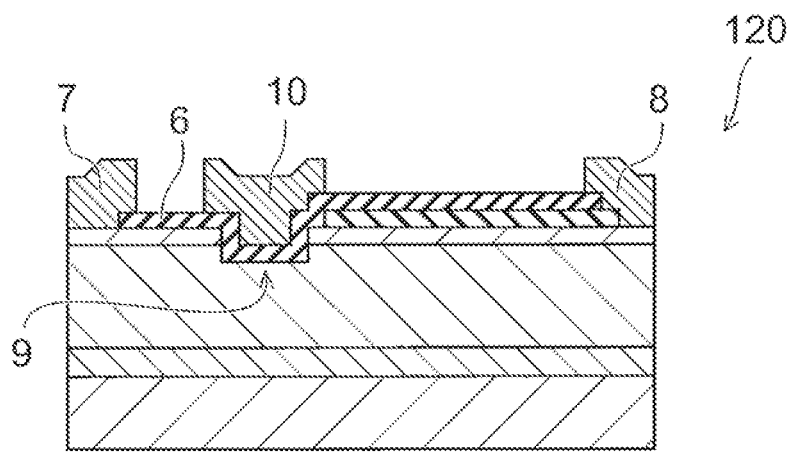

Then, as shown in FIG. 11C, the first electrode 10 is formed in the hole 4a. The first electrode 10 is formed in the hole 4a via the first insulating film 6. The first electrode 10 functions as the gate electrode. This completes the nitride semiconductor device 120 in which the second semiconductor layer 4 is in contact with the first insulating film 6 that is $SiO_2$ between the first electrode 10 and the second electrode 7.

Sixth Embodiment

A sixth embodiment is a method for manufacturing the nitride semiconductor device 130 according to the third embodiment.

Figure 12A:
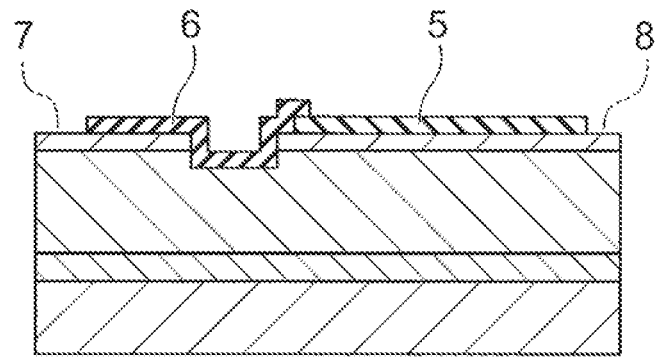
FIGS. 12A to 12C are schematic cross-sectional views describing an example of a manufacturing method sequentially.
Figure 12B:
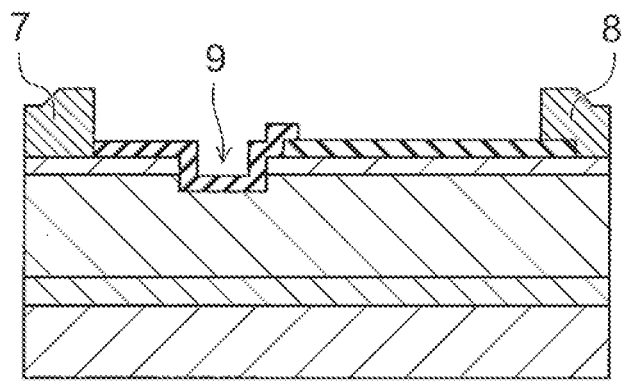
Figure 12C:
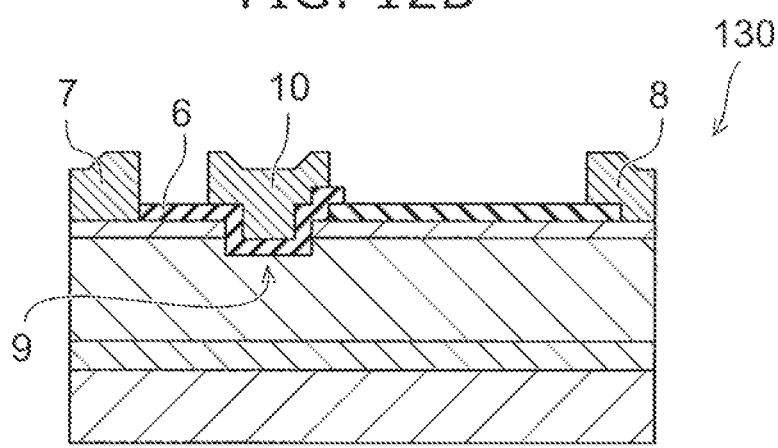

FIGS. 12A to 12C are schematic cross-sectional views describing an example of the method for manufacturing the nitride semiconductor device 130 sequentially.

In the manufacturing method according to the sixth embodiment, the processes illustrated in FIGS. 10A to 10D of the manufacturing method according to the fifth embodiment are similarly performed, and therefore a description is given from the subsequent process.

Next, as shown in FIG. 12A, the etching of the first insulating film 6 is performed. In the etching, the first insulating film 6 is removed in the position where the second electrode 7 will be formed and in the region from the position where the third electrode 8 will be formed to the position of the hole 4a. The first insulating film 6 that is $SiO_2$ is removed by, for example, wet etching. After the first insulating film 6 is etched, PDA treatment is performed. As the PDA treatment, for example, heat treatment of 900° C. and approximately 10 minutes is performed. This stabilizes the interface between the $SiO_2$ that is the first insulating film 6 and the nitride semiconductor (GaN or AlGaN).

Next, as shown in FIG. 12B, the second electrode 7 and the third electrode 8 are formed in the respective positions where the second semiconductor layer 4 is exposed. The third electrode 8 is formed on one side as viewed from the hole 4a, and the second electrode 7 is formed on the other side as viewed from the hole 4a. The second electrode 7 and the third electrode 8 are joined to the second semiconductor layer 4 by ohmic junction by, for example, heat treatment of 650° C. and approximately 15 seconds. The second electrode 7 functions as the source electrode, and the third electrode 8 functions as the drain electrode.

After the second electrode 7 and the third electrode 8 are formed, an element isolation region (not shown) is formed around the element region.

Then, as shown in FIG. 12C, the first electrode 10 is formed in the hole 4a. The first electrode 10 is formed in the hole 4a via the first insulating film 6. The first electrode 10 functions as the gate electrode. This completes the nitride semiconductor device 130.

In all the embodiments described above, a material that allows a nitride semiconductor to grow epitaxially is sufficient to be used for the support substrate 1. GaN, SiC, sapphire, and Si, for example, are given as the support substrate 1. The conduction type of the semiconductor layer may be one of an n type, a p type, and a semi-insulating type. In regard to the buffer layer 2 between the support substrate 1 and the first semiconductor layer 3, any material that can function as a base body during the growth of the first semiconductor layer 3 is sufficient to be used for the material thereof. For example, an AlN layer that has grown at low temperature and a superlattice structure in which AlGaN and GaN are alternately stacked may be used.

In all the embodiments described above, undoped GaN is used as the material of the first semiconductor layer 3. However, the main purpose of the first semiconductor layer 3 is to generate two-dimensional electron gas at the interface of the first semiconductor layer 3 on the second semiconductor layer 4 side and cause the generated two-dimensional electron gas to function as the channel. Therefore, the material of the first semiconductor layer 3 is not limited to undoped materials but a material doped to an n type or p type may be used. In addition to GaN, also a nitride semiconductor such as AlGaN, InAlN, and InAlGaN may be used for the first semiconductor layer 3. Furthermore, the first semiconductor layer 3 does not need to be a layer made of a single material but may be a stacked structure such as GaN and AlGaN, and GaN and p-type GaN.

In all the embodiments described above, undoped AlGaN is used as the material of the second semiconductor layer 4. However, the main function of the second semiconductor layer 4 is to generate two-dimensional electron gas at the interface of the first semiconductor layer 3 on the second semiconductor layer 4 side. Therefore, the material of the second semiconductor layer 4 is not limited to undoped materials but a material doped to an n type or p type may be used. In addition to AlGaN, also a nitride semiconductor such as InAlN and InAlGaN may be used for the second semiconductor layer 4. It is sufficient to satisfy the condition of having a band gap wider than that of the first semiconductor layer 3. Furthermore, the second semiconductor layer 4 does not need to be a layer made of a single material but may be a stacked structure such as AlGaN, GaN and AlGaN, and AlGaN and AlN.

Furthermore, although a structure that penetrates through the second semiconductor layer 4 and uses the first semiconductor layer 3 as the bottom is illustrated as the recess structure 9 in the embodiments described above, the second semiconductor layer 4 may be used as the bottom. In any embodiment, either of the recess structures 9 may be used to the extent that the function of a normally OFF element is obtained.

Furthermore, although $SiO_2$ is used as an example of the first insulating film 6 in all the embodiments described above, $AlO_x$, MgO, and $HfO_2$ are possible and also an oxide film including nitrogen such as SiON and HfSiON, which are common in Si devices, is possible. Moreover, although $SiN_x$ is used as an example of the second insulating film 5, also a high resistance nitride semiconductor such as AlN and BN is possible.

As described above, the nitride semiconductor device and the method for manufacturing the same according to the embodiment can achieve low ON resistance, high breakdown voltage, and high reliability.

Hereinabove, embodiments and variations thereof are described. However, the invention is not limited to these examples. For example, one skilled in the art may appropriately make additions, removals, and design changes of components to the embodiments or the variations described above, and may appropriately combine features of the embodiments; such variations also are included in the scope of the invention to the extent that the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
   a first semiconductor layer including a nitride semiconductor;
   a second semiconductor layer provided on the first semiconductor layer, the second semiconductor layer including a nitride semiconductor having a band gap wider than a band gap of the first semiconductor layer, the second semiconductor layer including a concave portion;
   a first electrode provided in the concave portion;
   a second electrode provided on the second semiconductor layer, the second electrode being electrically connected to the second semiconductor layer;
   a third electrode provided on the second semiconductor layer, the first electrode being disposed between the third electrode and the second electrode, the third electrode being electrically connected to the second semiconductor layer;
   a first insulating film provided between the first electrode and an inner wall of the concave portion, the first insulating film being in contact with the second semiconductor layer between the first electrode and an inner wall of the concave portion, the first insulating film being provided between the first electrode and the second electrode, the first insulating film being in contact with the second semiconductor layer between the first electrode and the second electrode, the first insulating film being spaced from the third electrode, an end of the first insulating film on a side of the third electrode being covered by the first electrode, the first insulating film being in direct contact with the second electrode, the first insulating film including oxygen; and
   a second insulating film provided in contact with the second semiconductor layer between the first electrode and the third electrode, the second insulating film including nitrogen, a material of the second insulating film being different from a material of the first insulating film.

2. The device according to claim 1, wherein the first electrode includes:
   a first portion provided in the concave portion; and
   a second portion electrically connected to the first portion, the second portion being spaced from the first portion, the second portion covering the end of the first insulating film on the side of the third electrode.

3. The device according to claim 1, wherein each of the first electrode, the second electrode, and the third electrode is provided in plural, each of a plurality of second electrodes and each of a plurality of third electrodes being disposed alternately, each of a plurality of first electrodes is disposed on a side of the each of the second electrodes between the each of the second electrodes and each of the third electrodes.

4. The device according to claim 3, further comprising:
a first pad electrically connected to the first electrodes;
a second pad electrically connected to the second electrodes; and
a third pad electrically connected to the third electrodes,
the second electrodes extending from the second pad in a first direction, the third electrodes extending from the third pad in a second direction, the second direction being opposite to the first direction.

5. The device according to claim 1, wherein the first insulating film is in direct contact with the first semiconductor layer, and the first semiconductor layer is the layer in which a two-dimensional electron as (2DEG) forms.

6. The device according to claim 1, wherein the second insulating film is covered by the first insulating film between the first electrode and the second electrode.

7. The device according to claim 1, wherein a portion of the second insulating film is covered by the first insulating film between the first electrode and the third electrode.

8. The device according to claim 1, wherein the first insulating film includes silicon oxide.

9. The device according to claim 1, wherein the second insulating film includes silicon nitride.

10. The device according to claim 1, wherein
the first semiconductor layer includes $Al_XGa_{1-X}N$ ($0 \leq X \leq 1$), and
the second semiconductor layer includes $Al_YGa_{1-Y}N$ ($0 \leq Y \leq 1$, $X \leq Y$).

11. The device according to claim 1, wherein the first semiconductor layer includes a channel in a normally OFF transistor.

12. The device according to claim 1, wherein
the first electrode is a gate electrode of a transistor,
the second electrode is a source electrode of the transistor, and
the third electrode is a drain electrode of the transistor.

13. The device according to claim 1, wherein a lower end of the first insulating film is positioned under an interface between the first semiconductor layer and the second semiconductor layer below the first electrode.

14. The device according to claim 1, wherein an interface between the first semiconductor layer and the second semiconductor layer is divided by the first insulating film.

15. The device according to claim 1, wherein each of a portion of the second electrode and a portion of the third electrode is provided on a portion of the second insulating film.

16. The device according to claim 1, wherein the first electrode is a mono layer, the first electrode is in contact with the first insulating film.

17. The device according to claim 1, wherein a portion of the second insulating film is provided between the second electrode and the second semiconductor layer in a direction from the first semiconductor layer toward the second semiconductor layer.

* * * * *